(12) United States Patent
Tang et al.

(10) Patent No.: US 6,885,577 B2
(45) Date of Patent: Apr. 26, 2005

(54) MAGNETIC RAM CELL DEVICE AND ARRAY ARCHITECTURE

(75) Inventors: Denny Duan-Lee Tang, Saratoga, CA (US); Wen-Chin Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/464,311

(22) Filed: Jun. 18, 2003

(65) Prior Publication Data

US 2004/0257868 A1 Dec. 23, 2004

(51) Int. Cl.[7] .............................................. G11C 11/00
(52) U.S. Cl. ...................... 365/158; 365/171; 365/173
(58) Field of Search ................................. 365/158, 171, 365/173; 257/295

(56) References Cited

U.S. PATENT DOCUMENTS

| | | | | |
|---|---|---|---|---|
| 5,793,697 A | * | 8/1998 | Scheuerlein | ........... 365/230.07 |
| 5,838,608 A | | 11/1998 | Zhu et al. | .................... 365/158 |
| 6,242,770 B1 | | 6/2001 | Bronner et al. | ............. 257/295 |
| 6,335,890 B1 | | 1/2002 | Reohr et al. | ............. 365/225.5 |
| 6,418,046 B1 | | 7/2002 | Naji | ........................... 365/158 |
| 6,456,524 B1 | | 9/2002 | Perner et al. | ............... 365/158 |
| 6,630,703 B1 | * | 10/2003 | Scheler et al. | ............. 257/295 |
| 6,639,830 B1 | * | 10/2003 | Heide | ......................... 365/158 |

OTHER PUBLICATIONS

U.S. patent application Publication US 2002/0001223 A1 to Saito et al., "Solid–State Magnetic Memory".
S. Tehrani, "Recent Development in Magnetic Tunnel Junction MRAM", IEEE Trans. On Magn. V36, No. 5, p. 2152, Sep. 2000.

* cited by examiner

*Primary Examiner*—Son T. Dinh
(74) *Attorney, Agent, or Firm*—Haynes and Boone, LLP

(57) ABSTRACT

A new magnetic RAM cell device is achieved. The device comprises a plurality MTJ cells each comprising a free layer and a pinned layer separated by a dielectric layer. A common conductive layer couples together all of the pinned layers of the MJT cell. A first end of the common conductive layer is switchably coupled to a programming line. A second end of the common conductive layer is switchably coupled to a ground. A plurality of diodes is used. Each diode is coupled between one of the MJT cells and one of a plurality of bit lines.

37 Claims, 8 Drawing Sheets

MAGNETIC RAM CELL DEVICE AND ARRAY ARCHITECTURE

BACKGROUND OF THE INVENTION (1) Field of the Invention

The invention relates to a magnetic RAM device and, more particularly, to a magnetic RAM device based on a magnetic tunnel junction cell.

(2) Description of the Prior Art

Magnetic memory devices, based on magnetic tunnel junction (MTJ) cells, are an important new type of memory technology. Magnetic RAM arrays can be formed on an integrated circuit to provide non-volatility, high speed, low writing energy, infinite write cycles, and immunity to radiation. These advantages make magnetic RAM a technology with great promise.

Referring now to FIG. 1, models of magnetic tunnel junction cells 10 and 30 are illustrated. A magnetic tunnel junction cell 10 and 30 comprises a pinned layer 14, a free layer 18, and a dielectric layer 22. Typically, the free layer 18 and the pinned layer 14 comprise ferromagnetic materials that can be magnetically oriented. The free layer 18 is configured such that the magnetic orientation can be changed, or rotated, by exposure to an external magnetic field. The pinned layer 14 is configured such that the magnetic orientation is fixed and will not respond to a typical magnetic field. The dielectric layer 22 typically comprises a relatively thin oxide layer capable of electrically isolating the free layer 18 from the pinned layer 14. The dielectric layer 22 may be called a tunnel layer. Because the dielectric layer 22 is very thin, perhaps only about 10 A, electron tunneling occurs at a low potential across the dielectric layer 22.

In the first MTJ cell 10, the pinned layer 14 and the free layer 18 are magnetically oriented in opposite directions. In the second MTJ cell 30, the pinned layer 14 and the free layer 18 are magnetically oriented in the same direction. If the same current value $I_{CONSTANT}$ 32 is forced through each cell 10 and 30, it is found that the first cell 10 voltage $V_1$ is larger than the second cell 30 voltage $V_2$. In general, the resistance of an opposite-oriented MTJ cell 10 is greater than the resistance of a same-oriented MTJ cell 30. Binary logic data ('0' and '1') can be stored in a MTJ cell and retrieved based on the cell orientation and resulting resistance. Further, since the stored data does not require a storage energy source, the cell is non-volatile.

Referring now to FIG. 2, the program scheme of a prior art, MTJ cell 10 is illustrated. The MTJ cell 10 is electrically coupled to a bit line (BL) 40 overlying the free layer 18. A program line (PL) 48 runs under the MTJ cell 10. However, the PL 48 is electrically isolated from the MTJ cell 10 by a dielectric material such that a large gap 58 exists. To program the cell, PL 48 conducts a writing current $I_{WRITE}$ to generate magnetic field $H_{DATA}$ 52. The direction of $H_{DATA}$ 52 depends on the direction of $I_{WRITE}$. In addition, an assist current $I_{ASSIST}$ is conducted by the BL 40. $I_{ASSIST}$ generates a magnetic field $H_{ASSIST}$ 56 that is orthogonal to the longitudinal axis of the cell 10. The $H_{ASSIST}$ 56 field assists the $H_{DATA}$ 52 field in switching the magnetic orientation of the free layer 18 but will not program the cell without the $H_{DATA}$ 52 field generated by the program line 48. Therefore, the cell 10 at the intersection of an active program line 48 and an active bit line 40 is programmed.

There are two significant problems with this design. First, the magnetic coupling between the PL 48 and the cell 10 is not optimal due to the gap 58. Therefore, a large writing current $I_{WRITE}$ must be used to generated adequate field strength. This large writing current can approach the electromigration limit of the conductor and prevents downward scaling of the RAM cell 10. Second, there can be many other non-selected cells that are exposed to magnetic fields generated by the active program line 48 and bit line 52.

Referring now to FIG. 3, an exemplary MRAM array 60 is illustrated. A 2×2 array of cells is shown. Each cell comprises a MTJ cell and a transistor as shown by R0 66 and M0 64, R1 70 and M1 68, R2 74 and M2 72, R3 78 and M3 76. Each transistor is coupled to a word line signal Wn 82 or Wn+1 86. A cell is written by asserting the word line of that cell, forcing a reading current through the bit line of that cell, and then measuring the voltage on that bit line. For example, to read the state of MTJ cell R1 70, the word line Wn 82 is asserted to turn ON M1 68. The free layer of R1 70 is thereby coupled to ground 80 through M1 68. Next, the reading current is forced on bit line Bn+1 94. Since only reading transistor M1 68 is turned ON, the reading current flows through the R1 cell 70 to ground 80. The voltage of Bn+1 is then measured to determine the state ('0' or '1') of the cell R1 70. Each cell has one reading transistor. Therefore, this type of MRAM architecture is called '1T1R'.

The cells are written using the method described above and illustrated in FIG. 2. Referring again to FIG. 3 and for example, the MTJ cell R2 74 is written by forcing the writing current through the programming line PLn+1 86 and the assist current though the bit line Bn 90. PLn+1 86 and Bn 90 intersect at cell R2 74 such that R2 is programmed. However, note that PLn+1 98 also runs under the non-selected cell R3 78. Therefore, cell R3 is "half-selected." The magnetic field generated by PLn+1 98 can disturb, or flip, the state of R3 78. In addition, Bn 90 also couples to the non-selected cell R0 66. The assist field created by Bn 90 can disturb the state of R0 66. These "half-select" disturbances can cause loss of data or change of switching thresholds.

Referring now to FIG. 4, a second prior art MRAM array architecture 100 is illustrated. This array 100 uses two transistors for each MTJ cell and is called a 2T1R array. To improve the programming efficiency, the programming current runs through the MTJ cell directly through the pinned layer or through a conductive layer laminated to the pinned layer. By running the programming current in the MTJ instead of in an adjacent conductor, the magnetic coupling is improved such that the programming current can be reduced to about ⅓ the level of the cell illustrated in FIG. 2. Referring again to FIG. 4, the programming current path is changed such that the longitudinal axis of the cell is orthogonal to the writing current path. In this way, the cells can be programmed solely by the magnetic field generated by the programming current without an assist field.

For example, the program cell R1 108, word line WI is asserted to turn ON transistors M3 109 and M4 110. Next, a writing current is passed through cell R1 108 either from P2 134 to P2' 138 or from P2' 138 to P2 134. The writing current will generated a magnetic field to orient the free layer in R1 108. Note that there are no half-selected cells since the programming current only flows through the selected cell. Each MRAM cell in this array 100 requires two transistors, two programming lines, a bit line, and a word line. While this MRAM architecture is a significant improvement over the previous art shown in FIGS. 1–3, the addition of a transistor to each cell is a significant disadvantage. Further, since both transistors must carry a large programming current, the transistors must be relatively large. In fact, the writing transistors occupy most of the cell area.

Several prior art inventions relate to magnetic RAM devices. U.S. Pat. No. 6,335,890 B1 to Reohr et al teaches a MRAM architecture where the MTJ array is configured in segmented bit slices. Each bit slice segment is coupled to a segmented word line. Current flows through the segmented word line to the group of cells in the bit slice during programming to generate a hard axis M-field. Bit line current generates the easy axis M-field that programs the MTJ cell state. However, there is no structure or method to apply an assist current or assist magnetic field to the MTJ cell through the pinned layer or anit-feromagnetic layer. U.S. Pat. No. 6,418,046 B1 to Naji shows a MRAM architecture using two arrays of MTJ devices. U.S. patent application 2002/0001223 A1 to Saito et al illustrates a tunnel junction ferromagnetic element with a series diode. U.S. Pat. No. 6,456,524 B1 to Perner et al shows a MRAM cell having a series diode. This reference does not disclose a segmented architecture or an effective writing method to eliminate half-selected cell disturbance. U.S. Pat. No. 6,242,770 B1 to Bronner et al teaches a MTJ cell having a diode. U.S. Pat. No. 5,838,608 to Zhu et al describes a MTJ cell with a diode.

SUMMARY OF THE INVENTION

A principal object of the present invention is to provide an effective and very manufacturable magnetic RAM integrated circuit device.

A further object of the present invention is to provide a magnetic RAM device comprising a magnetic-tunnel junction (MTJ) device.

A yet further object of the present invention is to reduce the average size of a small magnetic RAM cell by sharing writing transistors across several MTJ cells.

A yet further object of the present invention is to provide a reduced-size magnetic RAM cell with excellent cell performance and little non-selected cell disturbance.

Another further object of the present invention is to provide a method to form a magnetic RAM cell.

Another further object of the present invention to provide unique methods to read and write a magnetic RAM array device.

In accordance with the objects of this invention, a magnetic RAM cell device is achieved. The device comprises a plurality MTJ cells each comprising a free layer and a pinned layer separated by a dielectric layer. A common conductive layer couples together all of the pinned layers of the MTJ cells. A first end of the common conductive layer is switchably coupled to a programming line. A second end of the common conductive layer is switchably coupled to a ground. A plurality of diodes is used. Each diode is coupled between one of the MTJ cells and one of a plurality of bit lines.

Also in accordance with the objects of this invention, a magnetic RAM cell device is achieved. The device comprises a plurality MTJ cells each comprising a free layer and a pinned layer separated by a dielectric layer. A common conductive layer couples together all of the pinned layers of the MTJ cells. A first end of the common conductive layer is switchably coupled to a programming line. A second end of the common conductive layer is switchably coupled to a ground. A plurality of MOS transistors is used. Each MOS transistor is coupled between one of the MTJ cells and one of a plurality of bit lines.

Also in accordance with the objects of this invention, a magnetic RAM array device is achieved. The devices comprises a plurality of programming lines, a plurality of ground lines, a plurality of bit lines, a plurality of word lines, and a plurality of magnetic RAM sub-arrays. Each magnetic RAM sub-array comprises a plurality MTJ cells each comprising a free layer and a pinned layer separated by a dielectric layer. A common conductive layer couples together all of the pinned layers of the MTJ cells. A first switch is coupled between a first end of the common conductor layer and one of the programming lines. A second switch is coupled between a second end of the common conductive layer and one of the ground lines. The first and second switches are controlled by one of the word lines. A plurality of diodes is used. Each diode is coupled between one of the MTJ cells and one of the bit lines.

Also in accordance with the objects of this invention, a method of forming a magnetic RAM cell array is achieved. The method comprises forming an plurality of MTJ cells each comprising a free layer and a pinned layer separated by a dielectric layer. The MTJ cells are formed in a plurality of sub-arrays. A common conductive layer couples together all of the pinned layers of the MTJ cells in each sub-array. A plurality of first switches is formed and each coupled to the common conductive layer of one of the sub-arrays. A plurality of second switches are each formed and coupled to the common conductive layer of one of the sub-arrays. A plurality of diodes is formed. Each diode is coupled between one of the MTJ cells and one of the bit lines.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose magnetic RAM devices. Methods of forming, programming, and reading magnetic RAM devices are disclosed. It should be clear to those experienced in the art that the present invention can be applied and extended without deviating from the scope of the present invention.

Figure 5A:
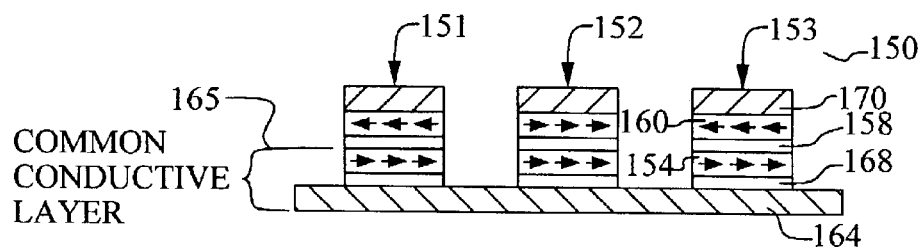
FIG. 5a illustrates a first preferred embodiment of a magnetic tunnel junction device of the present invention.

Referring now to FIG. 5a, a first preferred embodiment of the present invention is illustrated. Several important features of the present invention are shown and discussed below. A group 150 of MTJ cells 151, 152, and 153, called a sub-array 150, are illustrated. Each MTJ cell 151, 152, and 153 comprises a pinned layer 154 and a free layer 160 separated by a dielectric layer 158. The pinned layer 154 and free layer 160 preferably comprise ferromagnetic materials that can be magnetized. The dielectric layer 158 preferably comprises an oxide layer. In addition, the dielectric layer 158 is made relatively thin so that it will conduct current by tunneling when a sufficiently large voltage is applied across the dielectric layer 158.

Most important to the present invention, the sub-array 150 of MTJ cells 151, 152, and 153, further comprises a common conductive layer 165. The common conductive layer 165 is preferably a composite layer comprising a first conductive layer 164, an anti-ferromagnetic layer 168, and a pinned layer 154. The common conductive layer 165 couples together all of the pinned layers 154 of the cells 151, 152, and 153. The first conductive layer 164 preferably comprises aluminum, copper, titanium, tantalum, tungsten, or alloys of these metals. The first conductor layer 164 reduces the resistance of the pinned side of the cell, especially for programming. In addition, the common conductive layer 165 allows current to flow through the entire segment of MTJ cells 151, 152, and 153 and in close proximity to the cells. It is further understood that current flow can occur in any of the layers 165 on the pinned side of the cell, including the first conductive layer 164, the anti-ferromagnetic layer 168, and the pinned layer 154. The common conductive layer 165 comprising the pinned layer 154, anti-ferromagnetic layer 168, and first conductor layer 164 is also referred to simply as the pinned layer 154 in the remainder of the description.

A second conductor layer 170 may be added to the free side of the cell to reduce the resistivity during reading. Again, current flow can occur in either the free layer 160 or the second conductor layer 170. These two layers are simply referred to as the free layer in the remainder of the description.

The MRAM group, or sub-array 150, is shown comprising three MTJ cells 151, 152, and 153. Each sub-array 150 comprises at least two MTJ cells, and more preferably, between about 8 MTJ cells and about 128 MTJ cells. As a key feature, the common conductive layer 164 couples together all the pinned layers 154 such that a current running through the common conductive layer 164 can generate magnetic fields intersecting each of the MTJ cells 151, 152, and 153. In addition, the layer stack of the MTJ cells 151, 152, and 153 and the common conductive layer 164 could be inverted such that the common conductive layer 164 is on the top and the free layer 160 is on the bottom.

Figure 5B:
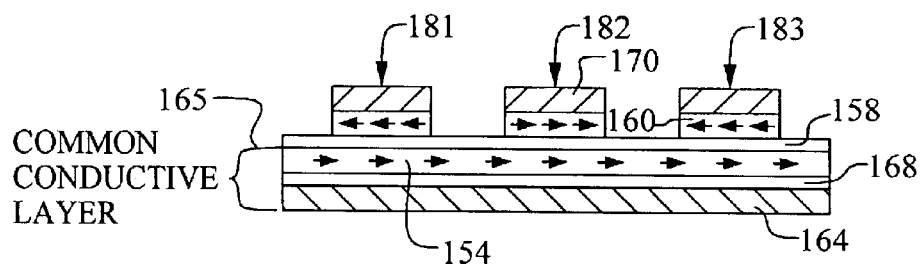
FIG. 5b illustrates a second preferred embodiment of a magnetic tunnel junction device of the present invention.

Referring now to FIG. 5b, a second preferred embodiment of the MTJ cell group is illustrated. In this case, only the free layer 160 and second conductor layer 170 are unique to each cell 181, 182, and 183. The remaining layers, including the dielectric layer 158, and the common conductive layer 165, comprising the pinned layer 154, the anti-ferromagnetic layer 168, and the first conductive layer 164, are conformally formed and not patterned to the individual MTJ cells 181, 182, and 183. In practice, however, it is difficult to stop the free layer 158 etch on the tunnel oxide of the dielectric layer 158 or on the pinned layer 154. Therefore, the first embodiment of the method wherein only the common conductive layer 164 extends across the sub-array, as shown in FIG. 5a, is easier to manufacture.

Figure 6A:
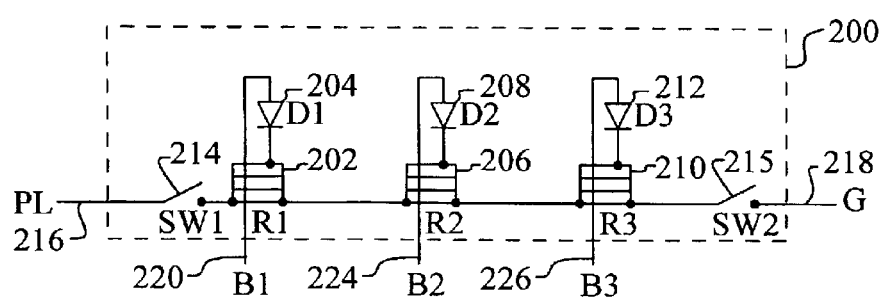
FIG. 6a illustrates a first preferred embodiment of a MRAM sub-array of the present invention.

Referring now to FIG. 6a, a first preferred embodiment of a MRAM array 200 of the present invention is illustrated in a schematic form. The array 200 uses the unique MRAM sub-array comprising, in this example, three MTJ cells R1 202, R2 206, and R3 210. Each MTJ cell comprises a pinned layer, a free layer, with a dielectric layer therebetween as discussed above. The common conductive layer causes the pinned layers of each cell to be coupled together. In addition, as an important feature, diodes D1 204, D2 208, and D3 212 are coupled to the free layer of each of the MTJ cells 202, 206, and 210. More preferably, the cathode of each diode is coupled to the free layer of the MTJ cell.

The diodes D1–D3 may comprise any of several known types. For example, the diodes may comprise a simple p-n junctions. Alternatively, bipolar transistors, such as p-n-p transistors or n-p-n transistors may be used where the base and emitter junctions or the base and collector junctions are shorted together. As a further alternative, metal-based diodes, or Shottky diodes may be used. Finally, MOS transistors, either p-channel or n-channel, may be used where the drain and gate are shorted together to create a MOS device that behaves according to a diode equation.

As another important feature, a means to switchably couple SW1 214 a first end of the common conductive layer to a programming line and a means to switchably couple SW2 215 a second end of the common conductive layer to a ground line G 218 are included. The means to switchably couple SW1 214 and SW2 215 comprise switches. More preferably, the switches SW1 214 and SW2 215 comprise MOS transistors of either n-channel or p-channel type. Alternatively, the switches SW1 214 and SW2 215 may comprise bipolar transistors, micro-mechanical switches, or thermal switches. The sub-array 200 further comprises first, a plurality of bit lines B1–B3, a programming line PL 216, and a ground line G 218.

Figure 9:
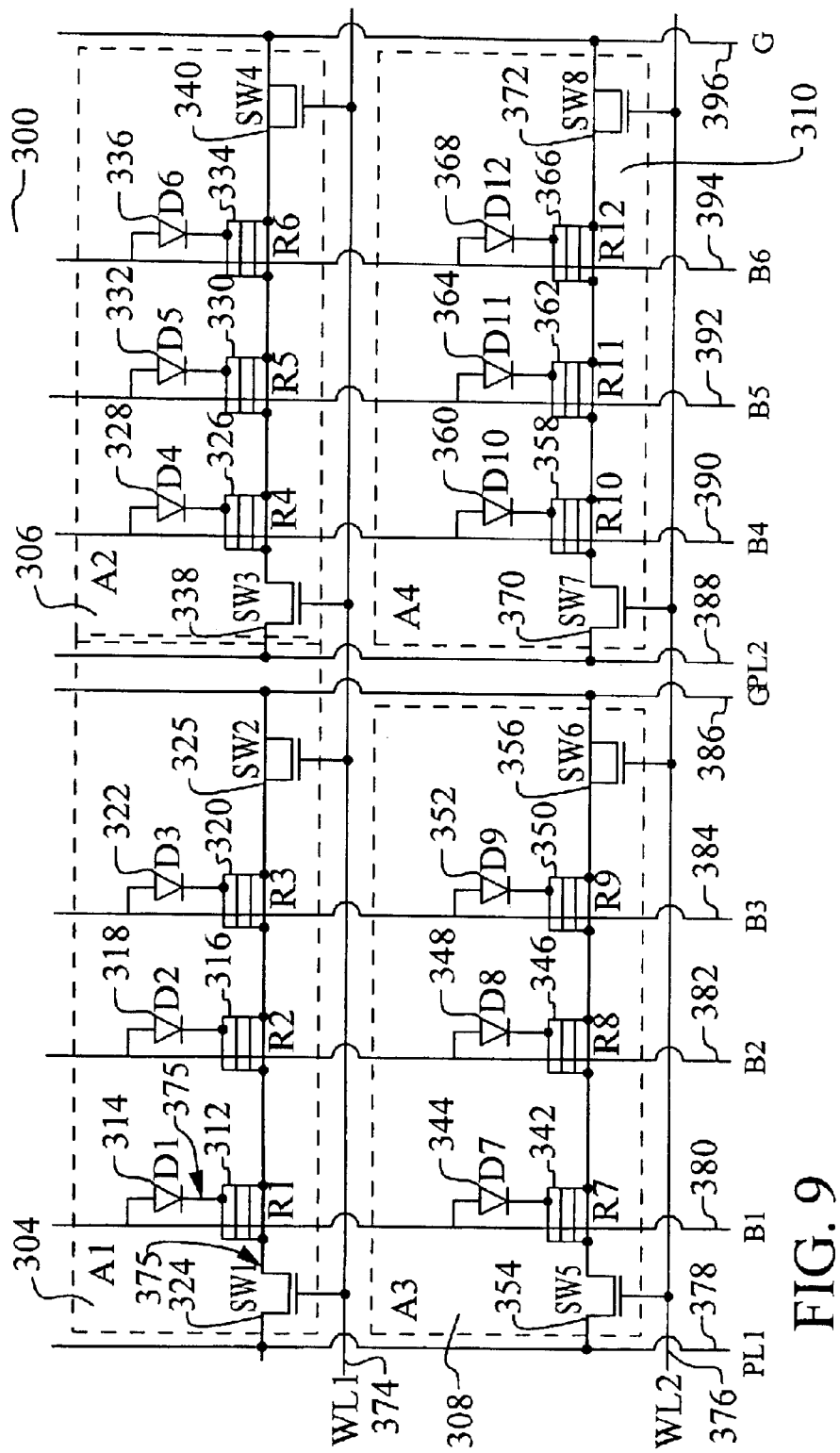
FIG. 9 illustrates the preferred embodiment of a MRAM array of the present invention.

This sub-array 200 arrangement has several unique features. First, the MRAM sub-array 200 has three MTJ cells R1-R3, three diodes D1–D3, and two access transistors SW1-SW2. Therefore, on a per-cell basis, each cell requires $2/3$ access transistors. In this example, the 3 MTJ cells R1 202, R2 206, and R3 210, form a 3-bit chain cell. This unit 200 further comprises six external lines. Three of the lines are the data lines, or bit lines B1 220, B2 224, B3 226, overlying the MTJ cells R1–R3. Two of the lines comprise the programming line PL 216 and the ground line G 218. Finally, a word line, not shown, is used to control the first and second switches SW1 214 and SW2 215 as is shown in FIG. 9 by, for example, WL1 374. Therefore, on average, each bit requires 2 lines, $2/3$ of a switch, 1 diode, and 1 MTJ cell. More generically, for a sub-array comprises n-bits, each bit requires 1 MTJ cell, 1 diode, 2/n switches, and (1+1/n) wires. It is found for a sub-array of size n>2, that the present invention has a smaller per unit cell size than the prior art 1T1R design in a similar technology dimension.

Figure 6B:
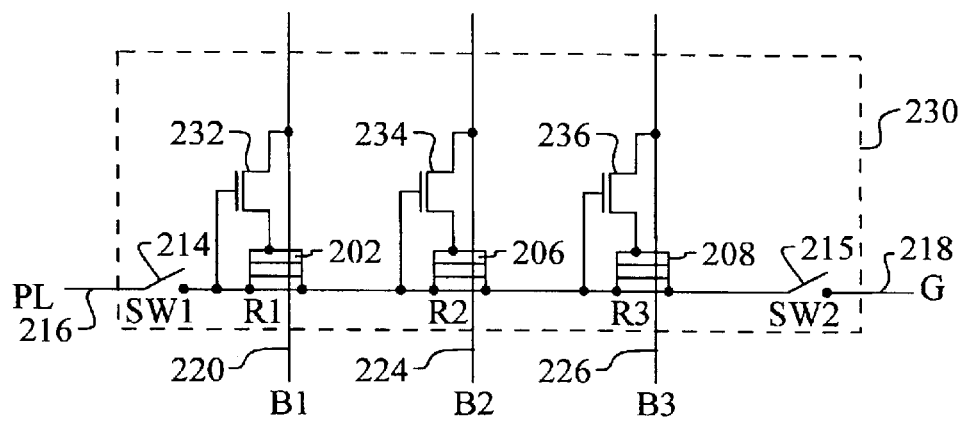
FIGS. 6b and 6c. illustrate a second preferred embodiment of a MRAM sub-array of the present invention.
Figure 6C:
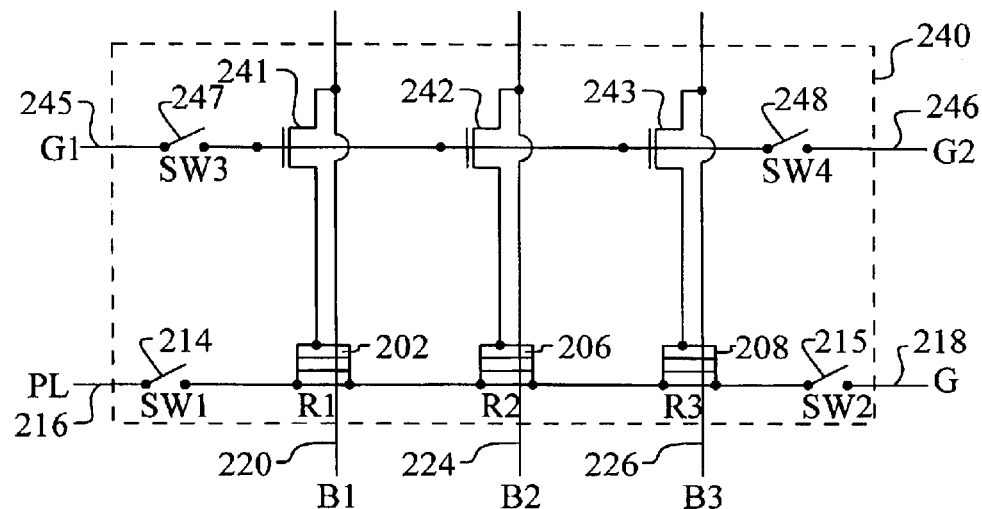

Referring now to FIGS. 6b and 6c, a second preferred embodiment of a MRAM array 230 of the present invention is illustrated in a schematic form. Referring in particular to FIG. 6b, the bit line diodes of the first embodiment are replaced with MOS transistors 232; 234, and 236. Each MOS transistor 232, 234, and 236 is coupled between the bit line B1 220, B2 224, and B3 226, and the free layer of the MTJ cell 202, 206, and 208, respectively. The MOS transistors function in similar fashion to the diodes of the first embodiment. The transistors 232, 234, and 236 conduct programming and reading current through the MTJ cell when that cell is selected by asserting the switches SW1 214 and SW2 215 and by asserting that cell's bit line B1–B3. The gates of the transistors 232, 234, and,236 are coupled to the common conductive layer of the MTJ cells R1–R3.

Figure 7:
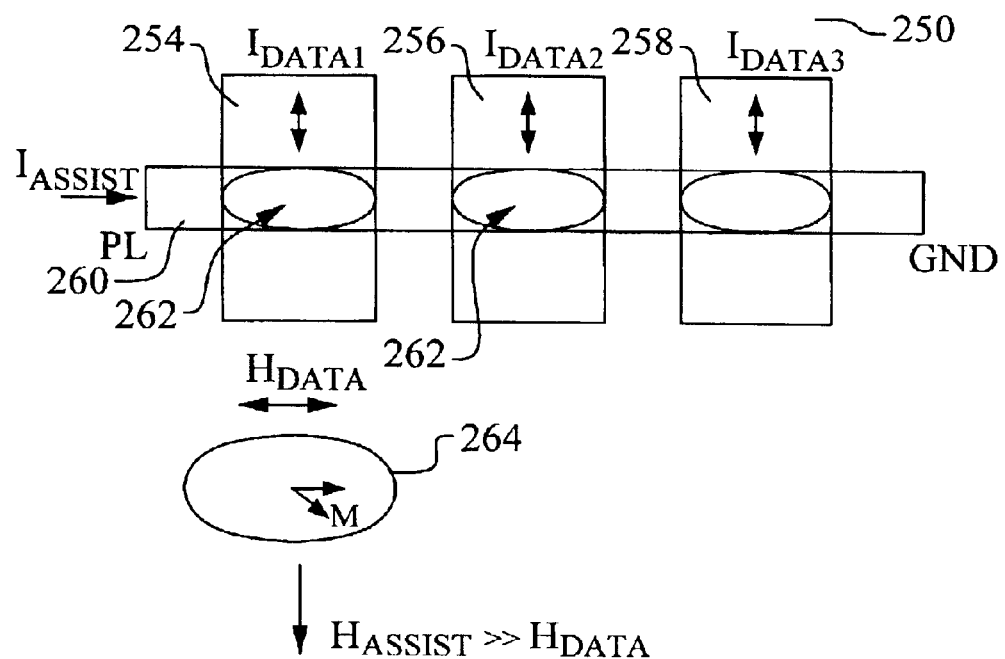
FIGS. 7 and 8 illustrate the programming mechanism of the present invention.

Referring now to FIG. 6c, and alternative form of the second embodiment MRAM array 240 of the present invention is illustrated in a schematic form. In this case, the gates of the transistors 241, 242, and 243 are connected to a gate select signal G1 245 and G2 246. This gate select line preferably comprises switches SW3 247 and SW4 248 so that only the local set of cells R1–R3, is selected. Referring now to FIG. 7, the sub-array 250 is illustrated in a top view. In this view, the common conductive layer 260 underlies each MTJ cell 262 from left to right. The data lines, or bit lines 254, 256, and 258, overlie each cell MTJ cell 262 from top to bottom. To write a cell in the sub-array, a program current $I_{ASSIST}$ flows in the common conductive layer 260 from the program line PL to ground GND. Note that the longitudinal axis of each MTJ cell 262 is in the same direction as the direction of the common conductive layer 260. The program current, $I_{ASSIST}$, generates a magnetic field, $H_{ASSIST}$, that is orthogonal to the axis of the MTJ cell 262. Since the assist program current flows along the longitudinal direction of each cell 262, the current path is narrower. Therefore, the assist magnetic field $H_{ASSIST}$ cannot switch the MTJ cell.

The magnetic field for switching the free layer in the MTJ cell 262 is generated by the data line 254, 256, 258. The bit line currents, such as $I_{DATA1}$, $I_{DATA2}$, or $I_{DATA3}$, generate the switching field, $H_{DATA}$, for each cell. The data lines 254, 256, and 258, overlie their respective MTJ cells 262 and are orthogonal to the common conductive layer 260. Therefore, the switching field, $H_{DATA}$ is along the cell axis direction. During programming, the direction of the data line current, such as $I_{DATA1}$, determines the orientation of the switching field, $H_{DATA}$, and this further determines the orientation of the free layer.

The assist field $H_{ASSIST}$ generated by the common conductive layer 260 is substantially larger than the data field $H_{DATA}$ generated by the data line 254. This is because the flux coupling of the common conductive layer 260 is greater than that of the data line 254. The magnetic fields add as shown by 264.

Figure 8:
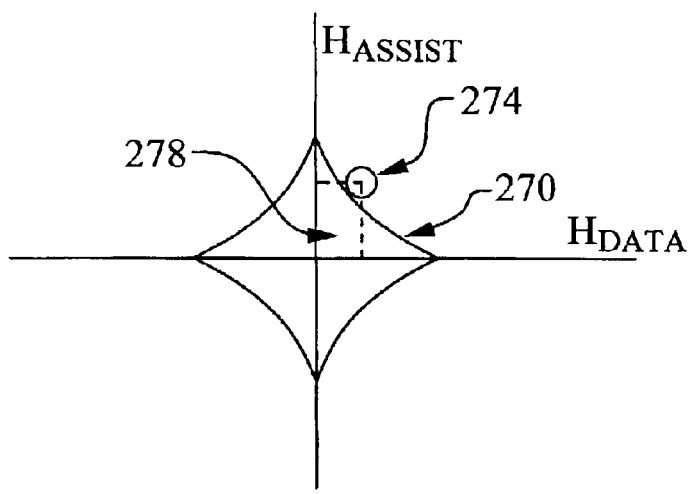

Referring now to FIG. 8, the writing threshold is based on the Stoner-Walfarth asteroid. To switch a cell, the vector addition of the assist field $H_{ASSIST}$ and the data field $H_{DATA}$ must exceed the asteroid 270 as shown by the data point 274. The switching magnetic field threshold of the cells on the common conductive layer is given by:

$$H_{sw}=(H_{DATA}^{2/3}-H_{ASSIST}^{2/3})^{3/2}.$$

By applying a large $H_{ASSIST}$, the switching field Hsw of the selected cells becomes very small. However, since the programming line PL is short, the assist filed $H_{ASSIST}$ acts only on the cells in the sub-array 250. All cells 262 on the common conductive layer 260 are selected. There are no half-selected cells as in the prior art. However, there are half-selected cells on each of the data lines 254, 256, and 258. As a significant benefit, the small Hsw prevents the write disturb problem of the prior art for half-selected cells since the data field $H_{DATA}$ is kept small. By comparison, the long programming lines of the prior art create many half-selected cells on each programming line. In the prior art case, $H_{DATA}$ is roughly the same magnitude as $H_{ASSIST}$. In the present invention, however, $H_{ASSIST}$ is significantly larger than $H_{DATA}$ because of the smaller spacing between the conductive layer carrying $I_{ASSIST}$ and the free layer 18 of the cell.

Referring now to FIG. 9, the preferred embodiment of a MRAM array 300 of the present invention is illustrated. The illustrated MRAM 300 comprises a 2×2 array of sub-arrays A1 304, A2 306, A3 308, and A4 310. In practice, very large arrays of sub-arrays may be constructed. Each sub-array comprises a plurality of MTJ cells having a common conductive layer, a plurality of diodes coupled to each MTJ cell, and first and second switches. In the exemplary array 300, each sub-array A1 304 comprises three MTJ cells, such as R1 312, R2 316, and R3 320. Diodes, such as D1 314, D2 318, and D3 322, are coupled to the each of the MTJ cells R1–R3. Two switches, such as SW1 324 and SW2 325, are included and preferably comprise MOS transistors. The first switch SW1 324 is coupled between the program line PL1 378 and a first end of the conductive layer.

Figure 10:
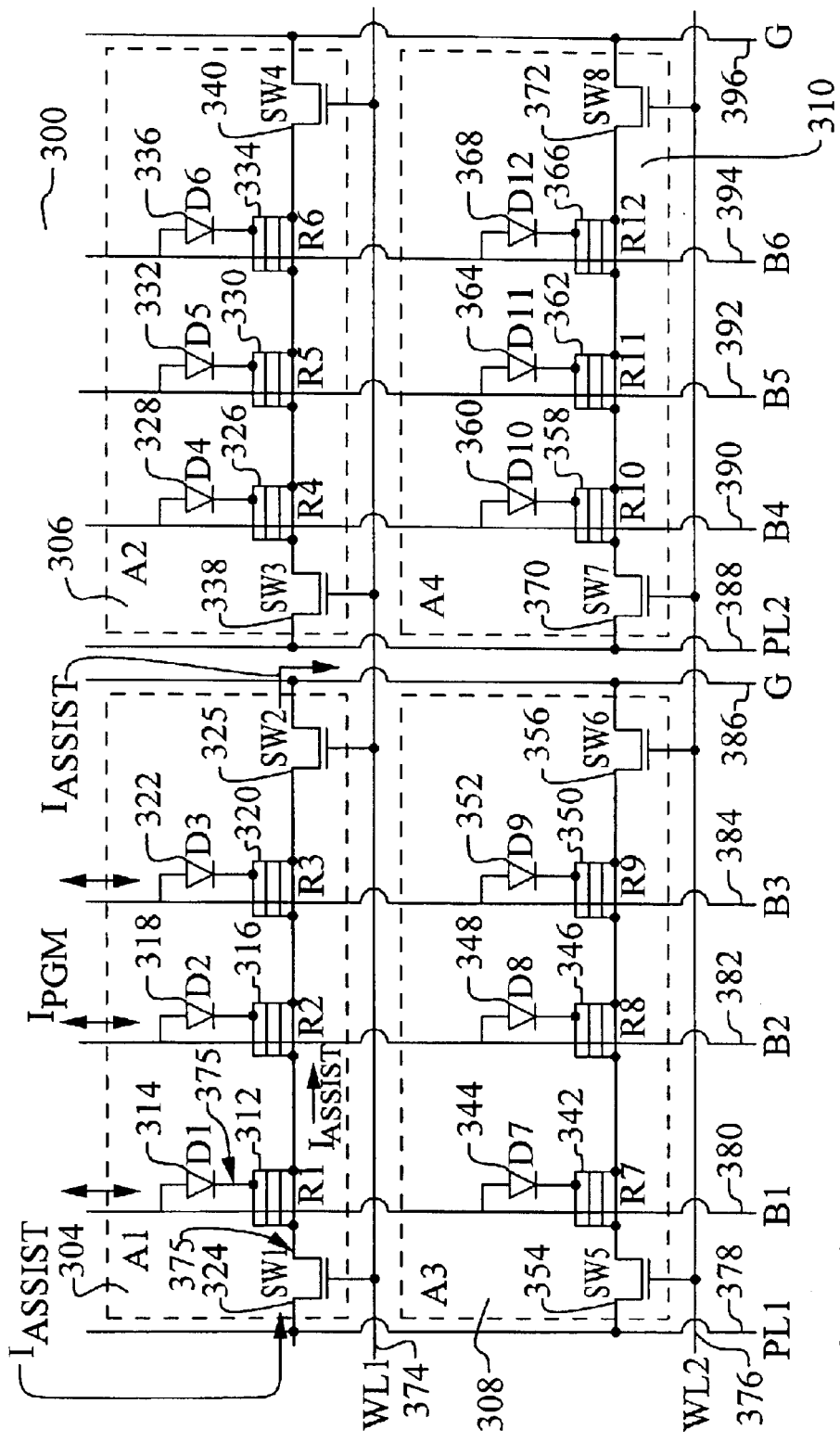
FIGS. 10 and 11 illustrate programming and reading methods of the present invention.
Figure 11:
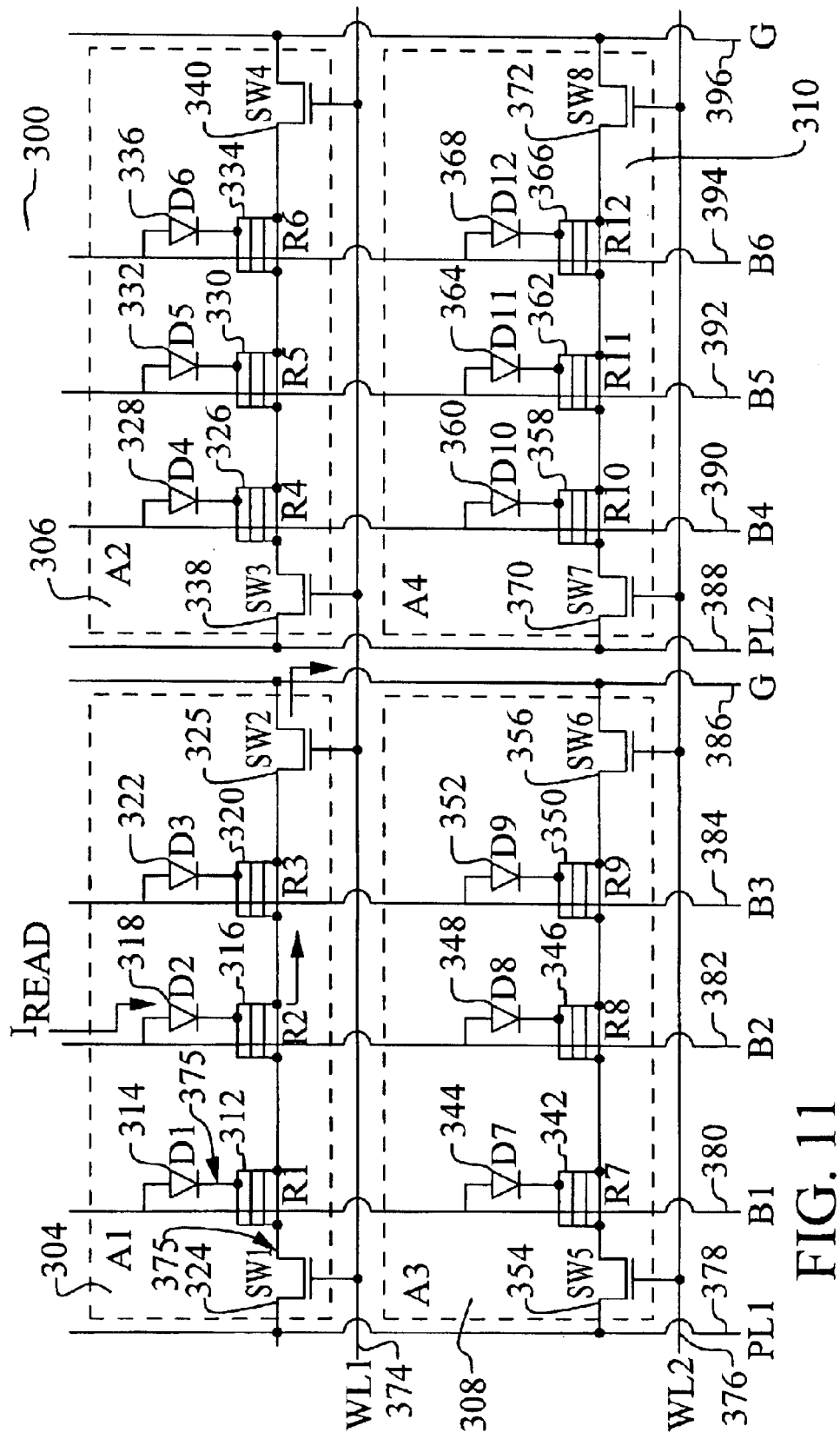

The second switch SW2 325 is coupled between the ground G 386 and a second end of the conductive layer. Each of the switches SW1 324 and SW2 325 are coupled to, and controlled by, common word lines WL1.374. Word lines WL1 374 and WL2 376 are commonly coupled to sub-arrays across the MRAM array 300. For example, sub-arrays A1 304 and A2 306 are coupled to the same word line WL1 374. Note that the above-described array and the arrays illustrated in FIGS. 10 and 11 are shown with the bit line diode embodiment of FIG. 6a. It should be understood that these arrays can be easily configured to use the bit line MOS transistors of the second embodiment cell shown in FIGS. 6b–6c and perform in similar fashion.

Figure 1:
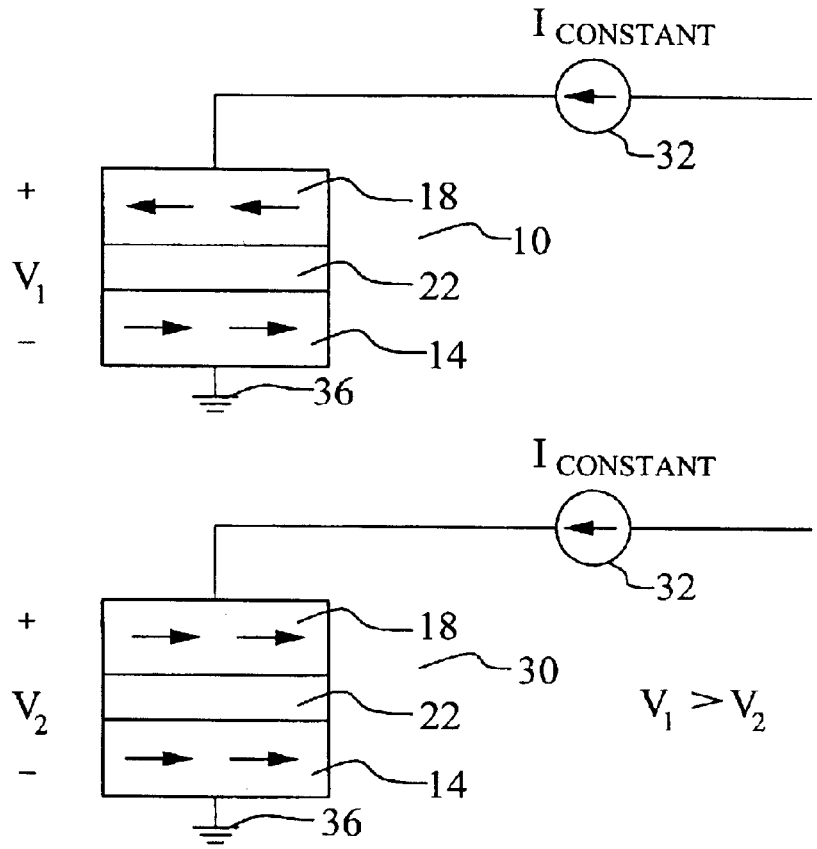
FIG. 1 illustrates reading a magnetic tunnel junction device.
Figure 2:
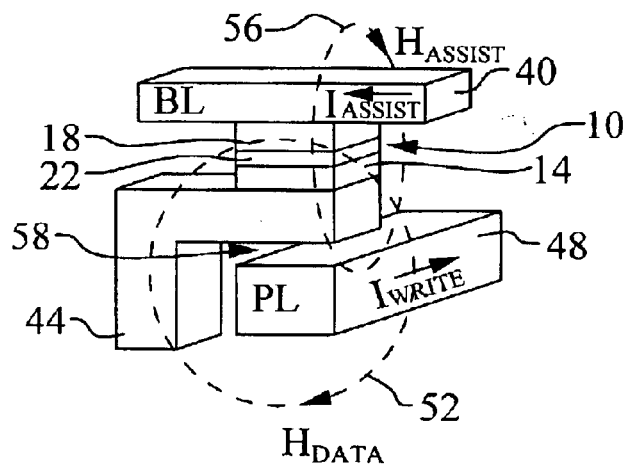
FIG. 2 illustrates writing a magnetic tunnel junction device.
Figure 3:
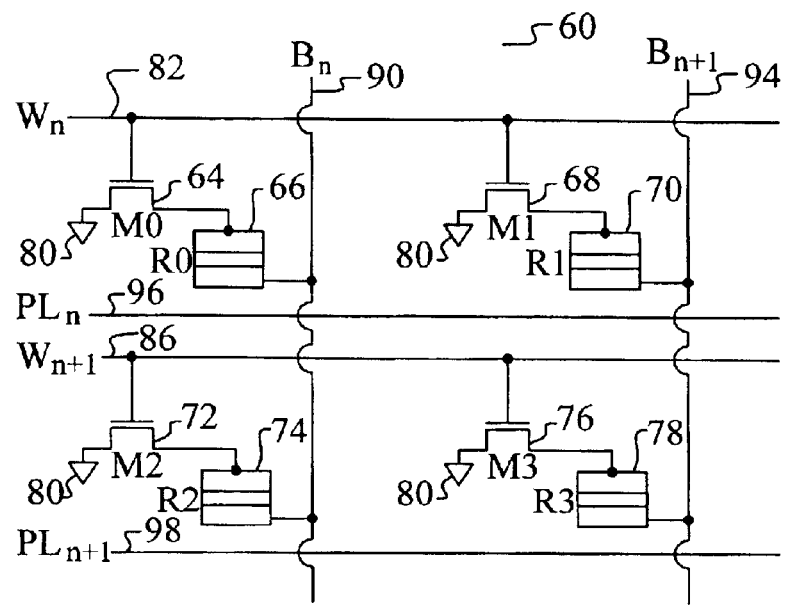
FIG. 3 illustrates a MRAM array of the prior art.
Figure 4:
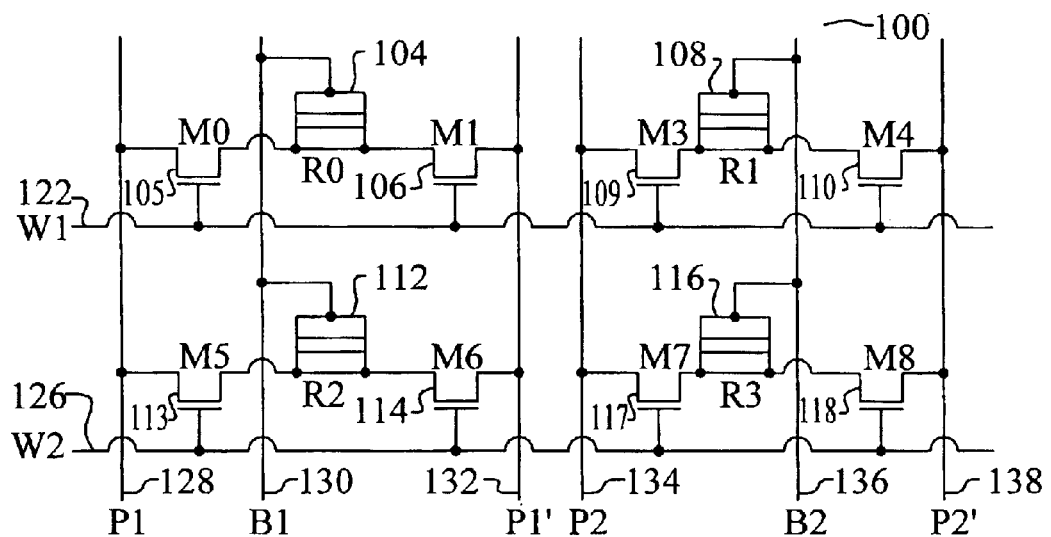
FIG. 4 illustrates an improved MRAM array of the prior art.

Referring now to FIG. 10, the MRAM array 300 is again illustrated. In this case, the conditions for programming cells are shown. As an example, cell R1 312 is written. First, the states of cells R2 316 and R3 320 are first read out to preserve these states. The method of reading is described below and illustrated in FIG. 11. The word line WL1 374 for the sub-array Al 304 is asserted to thereby turn ON switches SW1 324 and SW2 325. The assist current $I_{ASSIST}$ is thereby conducted through the common conductive layer and thereby generates the assist field $H_{FIELD}$ in the MTJ cells R1 312, R2 316, and R3 320. Programming current $I_{PGM}$ is conducted through each of the bit lines B1 380, B2 382, and B3 384 overlying the MTJ cells R1 312, R2 316, and R3 320. $I_{PGM}$ for cell R1 312 is applied in the required direction while $I_{PGM}$ is also applied to R2 316 and R3 320 "without" changing the original states. The programming current $I_{PGM}$ generates the data field $H_{DATA}$ for each cell depending on the direction of the programming current. The free layer of each MTJ cell R1 312, R2 316, and R3 320 is oriented based on the direction of $H_{DATA}$. Note that only the cells in the selected sub-array Al 304 receive the programming current. Cells in 308 also receive the programming current and, consequently, the magnetic field $H_{DATA}$. However, the disturbance of states is not caused because the programming current $I_{PGM}$ is much smaller than in the prior art (FIG. 3). Note also that the presence of the diodes D1–D12 prevents the programming current $I_{PGM}$ from conducting through the MTJ cells.

Referring now to FIG. 11, the MRAM array 300 is again illustrated. In this case, the conditions for reading a cell are shown. For example, to read MTJ cell R2 316 in sub-array A1 304, the word line WL1 374 to that sub-array is asserted to turn ON the second switch SW2. A reading current, $I_{READ}$, is then coupled onto the bit line B2 382 for cell R2 316. $I^{READ}$ is conducted through the diode D2 318, the free layer, the dielectric layer, and the pinned layer of the R2 316, and the common conductive layer to the ground line G 386. The voltage on the bit line B2 382 is then measured to determine the state of the MTJ cell R2 316.

Referring again to FIG. 9, a method for forming an MRAM is also achieved. The method comprises providing a plurality of MTJ cells R0–R12 each comprising a free layer and a pinned layer separated by a dielectric layer. A plurality of first switches SW1, SW3, SW5, and SW7, each comprising a MOS transistor having gate, drain, and source terminals, is formed. A plurality of second switches SW2, SW4, SW6, and SW8, each comprising a MOS transistor having gate, drain, and source terminals, is formed. A plurality of diodes D1–D12 is formed. A patterned conductive layer 375 is formed. The patterned conductive layer 375 selectively couples each of the first switches between a first end of the common conductive layer and a programming line. The patterned conductive layer 375 selectively couples each of the second switches between a second end of the common conductive layer and a ground line. The patterned conductive layer 375 selectively couples each of the diodes D1–D12 between a bit line B1–B6 and the free layer of a MTJ cell R1–R12.

The advantages of the present invention may now be summarized. An effective and very manufacturable magnetic RAM integrated circuit device is provided. A magnetic RAM device comprising a magnetic-tunnel junction (MTJ) device is achieved. The magnetic RAM sub-arrays comprise a plurality of MTJ cells coupled together by a common conductive layer, a plurality of diodes, and two switches. The magnetic RAM sub-arrays provide a reduced per-cell size. The magnetic RAM cells have low programming current. Efficient magnetic RAM array devices are achieved. Unique methods to write and to read a magnetic RAM cell are provided. A method to form a magnetic RAM array device is provided.

As shown in the preferred embodiments, the novel devices and method of the present invention provides an effective and manufacturable alternative to the prior art;

While the invention has been particularly shown and described with reference to the preferred embodiments thereof, it will be understood by those skilled in the art that various changes in form and details may be made without departing from the spirit and scope of the invention.

What is claimed is:

1. A magnetic RAM cell device comprising:
    a plurality MTJ cells each comprising a free layer and a pinned layer separated by a dielectric layer;
    a common conductive layer coupling together all of said pinned layers of said MTJ cells wherein a first end of said common conductive layer is switchably coupled to a programming line and wherein a second end of said common conductive layer is switchably coupled to a ground; and
    a plurality of diodes wherein each said diode is coupled between one of said MTJ cells and one of a plurality of bit lines.

2. The device according to claim 1 wherein said MTJ cells comprise a top conductive layer, a ferromagnetic free layer, a tunnel dielectric layer, a ferromagnetic pinned layer, an anti-ferromagnetic layer, and a bottom conductor layer.

3. The device according to claim 2 wherein said common conductive layer comprises said ferromagnetic pinned layer, said anti-ferromagnetic layer, and said bottom conductor layer.

4. The device according to claim 1 wherein the easy axis of said free layer is transverse to the longitudinal direction of said MTJ cells.

5. The device according to claim 1 wherein said switchable couplings comprise MOS transistors, bipolar transistors, micro-mechanical switches, or thermal switches.

6. The device according to claim 1 wherein said diodes are coupled to said free layers of said MTJ cells.

7. The device according to claim 1 wherein said diodes are p-n junctions, p-n-p transistors, or n-p-n transistors.

8. The device according to claim 1 wherein said diodes comprise Shottky diodes.

9. The device according to claim 1 wherein said diodes comprise MOS transistors.

10. The device according to claim 1 wherein said magnetic RAM cell device is written by a method comprising:
    coupling said first end of said common conductive layer to said programming line;
    coupling said second end of said common conductive layer to said ground;
    coupling a programming current through said first switch, said common conductive layer, and said second switch to generate a first magnetic field; and
    coupling a bit line current through said bit line of a selected said MTJ cell to generate a second magnetic field and to thereby program said free layer.

11. The device according to claim 1 wherein said magnetic RAM cell device is read by a method comprising:
    coupling said second end of said common conductive layer to said ground;
    coupling a reading current through said bit line, said free layer, said pinned layer, and said common conductive layer of a selected MTJ cell; and
    measuring voltage of said bit line of said selected MTJ cell.

12. The device according to claim 11 wherein more than one said MTJ cell is read simultaneously.

13. A magnetic RAM cell device comprising:
    a plurality MTJ cells each comprising a free layer and a pinned layer separated by a dielectric layer;
    a common conductive layer coupling together all of said pinned layers of said MTJ cells wherein a first end of said common conductive layer is switchably coupled to a programming line and wherein a second end of said common conductive layer is switchably coupled to a ground; and
    a plurality of MOS transistors wherein each said MOS transistor is coupled between one of said MTJ cells and one of a plurality of bit lines.

14. The device according to claim 13 wherein said MTJ cells comprise a top conductive layer, a ferromagnetic free layer, a tunnel dielectric layer, a ferromagnetic pinned layer, an anti-ferromagnetic layer, and a bottom conductor layer.

15. The device according to claim 14 wherein said common conductive layer/comprises said ferromagnetic pinned layer, said anti-ferromagnetic layer,-and said bottom conductor layer.

16. The device according to claim 13 wherein the easy axis of said free layer is transverse to the longitudinal direction of said MTJ cells.

17. The device according to claim 13 wherein said switchable couplings comprise MOS transistors, bipolar transistors, micro-mechanical switches, or thermal switches.

18. The device according to claim 13 wherein said MOS transistors are coupled to said free layers of said MTJ cells.

19. The device according to claim 13 wherein said magnetic RAM cell device is written by a method comprising:
    coupling said first end of said common conductive layer to said programming line;
    coupling said second end of said common conductive layer to said ground;
    coupling a programming current through said first switch, said common conductive layer, and said second switch to generate a first magnetic field; and
    coupling a bit line current through said bit line of a selected said MTJ cell to generate a second magnetic field and to thereby program said free layer wherein said MOS transistor is turned ON.

20. The device according to claim 13 wherein said magnetic RAM cell device is read by a method comprising:

coupling said second end of said common conductive layer to said ground;

coupling a reading current through said bit line, said free layer, said pinned layer, and said common conductive layer of a selected MTJ cell wherein said MOS transistor is turned ON; and measuring voltage of said bit line of said selected MTJ cell.

21. The device according to claim 20 wherein more than one said MTJ cell is read simultaneously.

22. A magnetic RAM array device comprising:

a plurality of programming lines;

a plurality of ground lines;

a plurality of bit lines;

a plurality of word lines; and a plurality of magnetic RAM sub-arrays each comprising:
  a plurality MTJ cells each comprising a free layer and a pinned layer separated by a dielectric layer;
  a common conductive layer coupling together all of said pinned layers of said MTJ cells;
  a first switch coupled between a first end of said common conductor layer and one of said programming lines;
  a second switch coupled between a second end of said common conductive layer and one of said ground lines wherein said first and second switches are controlled by one of said word lines; and
  a plurality of diodes wherein each said diode is coupled between one of said MTJ cells and one of said bit lines.

23. The device according to claim 22 wherein said MTJ cells comprise a top conductive layer, a ferromagnetic free layer, a tunnel dielectric layer, a ferromagnetic pinned layer, an anti-ferromagnetic layer, and a bottom conductor layer.

24. The device according to claim 23 wherein said common conductive layer comprises said ferromagnetic pinned layer, said anti-ferromagnetic layer, and said bottom conductor layer.

25. The device according to claim 22 wherein the easy axis of said free layer is transverse to the longitudinal direction of said MTJ cells.

26. The device according to claim 22 wherein said diodes are coupled to said free layers of said MTJ cells.

27. The device according to claim 22 wherein said diodes are p-n junctions, p-n-p transistors, n-p-n transistors, Shottky diodes, or MOS transistors.

28. The device according to claim 22 wherein said magnetic RAM cell array device is written by a method comprising:

asserting said word line of a selected said sub-array to turn ON said first and second switches of said selected sub-array and to thereby couple said first end of said common conductive layer to said programming line and to thereby couple said second end of said common conductive layer to said ground;

coupling a programming current through said first switch, said common conductive layer, and said second switch of said selected sub-array to thereby generate a first magnetic field in said selected sub-array; and coupling a bit line current through said bit line of a selected said MTJ cell of said selected sub-array to thereby generate a second magnetic field and to thereby program said free layer of said selected MTJ cell.

29. The device according to claim 22 wherein said magnetic RAM cell array device is read by a method comprising:

asserting said word line of a selected said sub-array to turn ON said second switch of said selected sub-array and to thereby couple said second end of said common conductive layer to said ground;

coupling a reading current through said bit line of a selected MTJ cell of said selected sub-array, said free layer, said pinned layer, and said conductive layer of a selected MTJ cell in said selected sub-array; and measuring voltage of said bit line of said selected MTJ cell.

30. The device according to claim 29 wherein more than one said MTJ cell in said selected sub-array is read simultaneously.

31. A method of forming a magnetic RAM cell array comprising:

forming an plurality of MTJ cells each comprising a free layer and a pinned layer separated by a dielectric layer wherein said MTJ cells are formed in a plurality of sub-arrays and wherein a common conductive layer couples together all of said pinned layers of said MTJ cells in each said sub-array;

forming a plurality of first switches each coupled to said common conductive layer of one of said sub-arrays;

forming a plurality of second switches each coupled to said common conductive layer of one of said sub-arrays;

forming a plurality of diodes wherein each said diode is coupled between to one of said MTJ cells.

32. The method according to claim 31 wherein said MTJ cells comprise a top conductive layer, a ferromagnetic free layer, a tunnel dielectric layer, a ferromagnetic pinned layer, an anti-ferromagnetic layer, and a bottom conductor layer.

33. The method according to claim 32 wherein said common conductive layer comprises said ferromagnetic pinned layer, said anti-ferromagnetic layer, and said bottom conductor layer.

34. The method according to claim 31 wherein the easy axis of said free layer is transverse to the longitudinal direction of said MTJ cells.

35. The. method according to claim 31 wherein said first and second switches are MOS transistors, bipolar transistors, micro-mechanical switches, or thermal switches.

36. The method according to claim 31 wherein said diodes are coupled to said free layers of said MTJ cells.

37. The method according to claim 31 wherein said diodes are p-n junctions, p-n-p transistors, n-p-n transistors, Shottky diodes, or MOS transistors.

* * * * *